(12) United States Patent
Kwon et al.

(10) Patent No.: US 8,817,931 B2
(45) Date of Patent: Aug. 26, 2014

(54) APPARATUS AND METHOD FOR ENVELOPE DETECTION

(75) Inventors: Ui Kun Kwon, Hwaseong-si (KR); Sang Joon Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 13/481,998

(22) Filed: May 29, 2012

(65) Prior Publication Data

US 2013/0089127 A1 Apr. 11, 2013

(30) Foreign Application Priority Data

Oct. 7, 2011 (KR) ........................ 10-2011-0102237

(51) Int. Cl.
H04L 27/22 (2006.01)

(52) U.S. Cl.
USPC ........... 375/355; 375/224; 375/334; 375/322; 375/316

(58) Field of Classification Search
USPC ........................ 375/224, 355, 334, 322, 316
See application file for complete search history.

(56) References Cited

U.S. PATENT DOCUMENTS

| 4,857,859 | A | * | 8/1989 | Asahi et al. | 329/363 |
| 5,852,630 | A | * | 12/1998 | Langberg et al. | 375/219 |
| 6,044,277 | A | * | 3/2000 | Tsuda | 455/522 |
| 6,668,032 | B1 | * | 12/2003 | Nayler | 375/355 |
| 7,738,605 | B2 | | 6/2010 | Mobin et al. | |
| 2002/0175850 | A1 | * | 11/2002 | Barnes et al. | 342/22 |
| 2008/0031389 | A1 | * | 2/2008 | Yamamoto | 375/347 |
| 2011/0077907 | A1 | | 3/2011 | Szajnowski | |
| 2013/0278072 | A1 | * | 10/2013 | Yoon et al. | 307/104 |
| 2013/0278318 | A1 | * | 10/2013 | Kwon et al. | 327/309 |

FOREIGN PATENT DOCUMENTS

KR 10-2002-0081011 A 10/2002

* cited by examiner

Primary Examiner — Kenneth Lam
(74) Attorney, Agent, or Firm — NBIP Law

(57) ABSTRACT

An apparatus and a method are described for envelope detection used in fields including voice processing, image processing, data communication, and energy/data transmission. The apparatus and the method for envelope detection eliminate a carrier component from a modulated signal by performing a square-sum operation between two adjacent sampling signals among signals sampled from the modulated signal. The apparatus and the method detect an envelope of the modulated signal from the modulated signal in which the carrier component is eliminated.

27 Claims, 11 Drawing Sheets

APPARATUS AND METHOD FOR ENVELOPE DETECTION

CROSS-REFERENCE TO RELATED APPLICATION(S)

This application claims the benefit under 35 U.S.C. §119(a) of Korean Patent Application No. 10-2011-0102237, filed on Oct. 7, 2011, in the Korean Intellectual Property Office, the entire disclosure of which is incorporated herein by reference.

BACKGROUND

1. Field

The following description relates to an apparatus for envelope detection used in fields including, but not limited to, voice processing, image processing, data communication, and energy/data transmission.

2. Description of Related Art

Envelope detection may be used for a process of demodulating a modulated signal. Thus, the envelope detection may be used for various fields involving a process of receiving and demodulating a modulated signal including voice processing, image processing, data communication, and other similar technologies.

Research into wireless power transmission has been conducted to handle limited capacity of a conventional battery. An increasing inconvenience of a wired power provision is due to the sudden increase in a number of various devices including portable devices, and other similar devices. The research is mainly focused on near-field wireless power transmission. Near-field wireless power transmission refers to a case in which a distance between transmission and reception coils is sufficiently short when compared to a wavelength at an operating frequency. A wireless power transmission and reception system using a resonance characteristic may include a source to provide power and a target to receive the power.

In a process of transmitting and receiving wireless power, the source and the target may share control information. In sharing the control information, mutual synchronization between the source and the target may be used. For the mutual synchronization, an envelope is detected so that the target may demodulate a modulated signal transmitted from the source.

SUMMARY

In accordance with an illustrative example, there is provided an apparatus for envelope detection including a controller configured to eliminate a carrier component from a modulated signal by performing a square-sum operation between two adjacent signals sampled from the modulated signal. The apparatus also includes an envelope detector configured to detect an envelope of the modulated signal in which the carrier component is eliminated.

The apparatus further includes a sampling unit configured to sample the modulated signal so that a sampling time interval between the two adjacent signals sampled satisfies $(\frac{1}{2}+n)*(\pi/\omega)$, wherein n corresponds to an integer and $\omega$ corresponds to an angular frequency.

The controller includes a square processor configured to square each of the two adjacent signals sampled, and a synthesizer configured to synthesize the two squared adjacent signals sampled.

The envelope detector detects the envelope of the modulated signal by performing a square-root operation on a value resulting from the square-sum operation.

The value resulting from the square-sum operation refers to a square of an envelope component of the modulated signal.

A first sampling signal, a second sampling signal, a third sampling signal, and a fourth sampling signal are sampled from the modulated signal in a chronological order. The controller squares and synthesizes each of the first sampling signal and the second sampling signal, and squares and synthesizes each of the third sampling signal and the fourth sampling signal.

A first sampling signal, a second sampling signal, a third sampling signal, and a fourth sampling signal are sampled from the modulated signal in a chronological order. The controller squares and synthesizes each of the first sampling signal and the second sampling signal, squares and synthesizes each of the second sampling signal and the third sampling signal, and squares and synthesizes each of the third sampling signal and the fourth sampling signal.

The sampling unit determines a value of n based on a bandwidth value of the modulated signal.

The sampled signals correspond to signals from an analog-to-digital converter sampled from a waveform of energy stored in a target resonator through a mutual resonance with a source resonator.

The apparatus further includes a slope calculator configured to calculate a slope of the detected envelope. The apparatus includes an estimator configured to estimate a point in time at which the calculated slope reaches a maximum value, to be a starting point for a mutual resonance between the source resonator and the target resonator.

The sampled signals correspond to signals from an analog-to-digital converter sampled from a voice analog signal.

The sampled signals correspond to signals from an analog-to-digital converter sampled from a video analog signal.

In accordance with another illustrative configuration, there is provided an apparatus for envelope detection, including a calculator configured to calculate a square of an envelope component of a modulated signal by performing a square-sum operation between two adjacent signals sampled from the modulated signal.

The apparatus also includes a sampling unit configured to sample the modulated signal so that a sampling time interval between the two adjacent signals sampled satisfies $(\frac{1}{2}+n)*(\pi/\omega)$, wherein n corresponds to an integer and $\omega$ corresponds to an angular frequency.

The sampling unit determines the sampling time interval based on a bandwidth value of the modulated signal.

The calculator calculates a square of the envelope component at a same rate as a sampling rate to sample the modulated signal by successively performing a square-sum operation between the two adjacent sampling signals.

In accordance with a further configuration, there is provided a method for envelope detection, including eliminating a carrier component from a modulated signal by performing a square-sum operation between two adjacent signals sampled from the modulated signal. The method also includes detecting an envelope of the modulated signal in which the carrier component is eliminated.

The method includes sampling the modulated signal so that a sampling time interval between the two adjacent signals sampled satisfies $(\frac{1}{2}+n)*(\pi/\omega)$, wherein n corresponds to an integer and $\omega$ corresponds to an angular frequency.

The detecting includes detecting the envelope of the modulated signal by performing a square-root operation on a value resulting from the square-sum operation.

The square-sum operation includes outputting the value as a square of an envelope component of the modulated signal.

The performing includes determining a value of n based on a bandwidth value of the modulated signal.

The method further includes squaring each of the two adjacent signals sampled, and synthesizing the two squared adjacent signals sampled.

The detecting of the envelope of the Modulated signal includes performing a square-root operation on a value resulting from the square-sum operation. The value resulting from the square-sum operation refers to a square of an envelope component of the modulated signal.

The method further includes sampling a first sampling signal, a second sampling signal, a third sampling signal, and a fourth sampling signal from the modulated signal in a chronological order, and squaring and synthesizing each of the first sampling signal and the second sampling signal. The method also includes squaring and synthesizing each of the third sampling signal and the fourth sampling signal.

The method also includes sampling a first sampling signal, a second sampling signal, a third sampling signal, and a fourth sampling signal from the modulated signal in a chronological order, and squaring and synthesizing each of the first sampling signal and the second sampling signal. The method includes squaring and synthesizing each of the second sampling signal and the third sampling signal, and squaring and synthesizing each of the third sampling signal and the fourth sampling signal.

The method includes calculating a slope of the detected envelope. The method also includes estimating a point in time at which the calculated slope reaches a maximum value, to be a starting point for a mutual resonance between the source resonator and the target resonator.

In accordance with a further configuration, there is provided a computer program embodied on a non-transitory computer readable medium, the computer program being configured to control a processor to perform the method of envelope detection, including eliminating a carrier component from a modulated signal by performing a square-sum operation between two adjacent signals sampled from the modulated signal. The computer program is also configured to control a processor to perform detecting an envelope of the modulated signal in which the carrier component is eliminated.

Other features and aspects will be apparent from the following detailed description, the drawings, and the claims.

Figure 1:
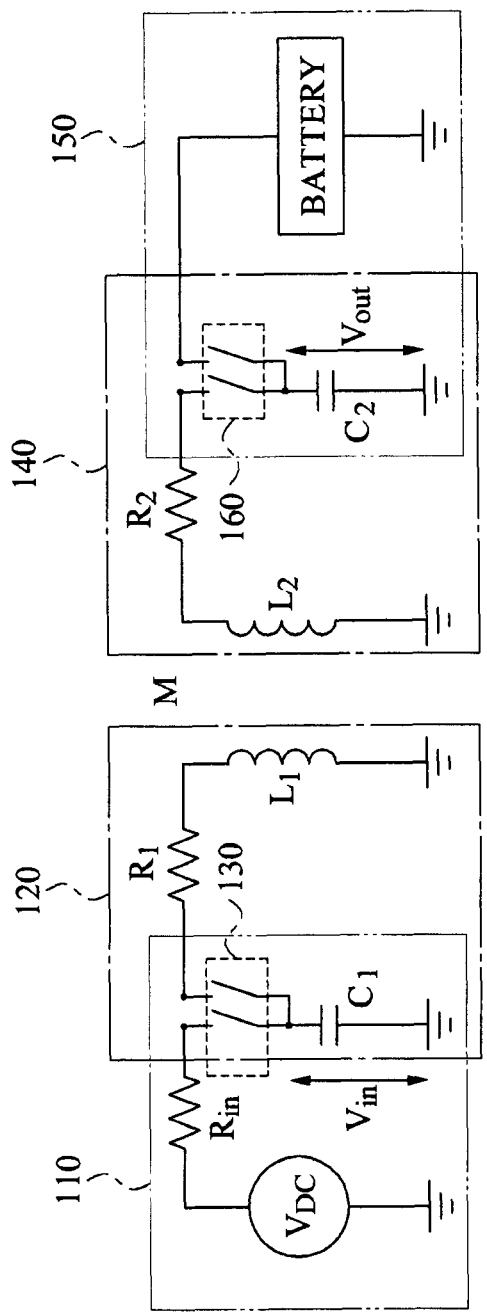
FIG. 1 is a diagram illustrating an example of a circuit of a communication system using wireless power.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, non-transitory computer readable medium, and/or systems described herein. Accordingly, various changes, modifications, and equivalents of the methods, apparatuses, non-transitory computer readable medium, and/or systems described herein will be suggested to those of ordinary skill in the art. The progression of processing steps described is an example; however, the sequence of and/or operations is not limited to that set forth herein and may be changed as is known in the art, with the exception of steps necessarily occurring in a certain order. Also, description of well-known functions and constructions may be omitted for increased clarity and conciseness.

Envelope detection is used for various fields including voice processing, image processing, data communication, and other various fields. Nowadays, a field in which energy and data are simultaneously transmitted may use envelope detection.

An envelope may be detected in a scheme using hardware such as an analog circuit. In this instance, the analog circuit may include a rectifier, a low pass filter, and other suitable devices. The envelope may also be detected by demodulating a modulated signal using a local oscillator in a manner similar to a communication receiver, and by filtering a demodulated signal in a baseband.

For a discrete signal, an envelope may be detected in a signal processing scheme. In this instance, the discrete signal may correspond to a signal sampled from an analog signal through an analog-to-digital converter.

Accurately detecting an envelope in a scheme using hardware may be difficult due to a ripple and a negative clipping effect. Also, detecting an envelope from a small amplitude signal may be difficult due to a threshold of a diode.

In some systems, a scheme to detect an envelope using a local oscillator and a filter may expend a relatively large amount of power due to a complicated calculation and several modules mounted to a body w.

In accordance with an illustrative embodiment, an apparatus is described for envelope detection that can easily detect an envelope by performing a square-sum-root (SSR) operation on signals sampled at predetermined sampling intervals.

The apparatus for envelope detection may be applied to a communication system using wireless power.

The apparatus for envelope detection may be used to exchange control information and other types of information between a transmission end and a reception end in a system using a wireless power transmission such as a cell phone, a wireless television (TV), and other similar devices. The apparatus for envelope detection may be applied to a bio-healthcare field. For example, the apparatus may be used to remotely transmit power to a device inserted into a body, or to wirelessly transmit power to a bandage-type device for measuring a heartbeat.

In an illustrative configuration, a communication system using wireless power may be applied to a remote control of an information storage device excluding a power source. The communication system may be applied to a system to remotely provide power to drive a device to the information storage device, and to wirelessly load information stored in the information storage device.

The communication system using wireless power stores a signal by storing energy from a power supply device in a source resonator, generates a signal, and turns off a switch that electrically connects the power supply device and the source resonator, thereby inducing self-resonance of the source resonator. When a target resonator having the same resonant frequency as a resonant frequency of a self-resonating source resonator is sufficiently near to the source resonator, a mutual resonance may occur between the source resonator and the target resonator.

The source resonator may refer to a resonator provided with energy from a power supply device, and the target resonator may refer to a resonator receiving energy delivered through a mutual resonance with the source resonator.

FIG. 1 illustrates a circuit of a communication system using wireless power, in accordance with an illustrative configuration. In the communication system, a power input unit 110 and a power transmission unit 120 are physically isolated by a capacitor $C_1$ and a switch unit 130. Also, in the communication system, a receiver 140 and a power output unit 150 are physically isolated by a capacitor $C_2$ and a switch unit 160.

Referring to FIG. 1, the communication system using wireless power may correspond to a source-target configuration having a source and a target. The communication system using wireless power may include a wireless power transmission device corresponding to a source and a wireless power reception device corresponding to a target.

The wireless power transmission device includes the power input unit 110, the power transmission unit 120, and the switch unit 130. The power input unit 110 includes an input voltage $V_{DC}$, an internal resistance $R_{in}$, and a capacitor $C_1$. The power transmission unit 120 includes basic circuit elements $R_1$, $L_1$, and $C_1$ which reflect a physical property corresponding to the power transmission unit 120. The switch unit 130 includes a plurality of switches. An active device may be used as a switch to perform an ON and OFF function. Here, R denotes a resistance component, L denotes an inductor component, and C denotes a capacitance component. A voltage across the capacitor $C_1$ corresponding to a portion of the input voltage $V_{DC}$ may be indicated by $V_{in}$.

The power input unit 110 stores energy in the capacitor $C_1$ using a power supply device. The switch unit 130 connects the capacitor $C_1$ to the power input unit 110 while energy is stored in the capacitor $C_1$, and may disconnect the capacitor $C_1$ from the power input unit 110. As a result, the capacitor $C_1$ is connected to the power transmission unit 120 while energy stored in the capacitor $C_1$ is discharged. The switch unit 130 prevents the capacitor $C_1$ from being simultaneously connected to the power input unit 110 and the power transmission unit 120.

The power transmission unit 120 transfers electromagnetic energy to the receiver 140. A transmission coil $L_1$ of the power transmission unit 120 transfers power through a mutual resonance with a reception coil $L_2$ of the receiver 140. A level of the mutual resonance occurring between the transmission coil $L_1$ and reception coil $L_2$ is affected by a mutual inductance M.

The wireless power reception device includes the receiver 140, the power output unit 150, and the switch unit 160. The receiver 140 receives electromagnetic energy from the power transmission unit 120. The receiver 140 stores received electromagnetic energy in a connected capacitor. The switch unit 160 operatively connects the capacitor $C_2$ to the receiver 140 while energy is stored in the capacitor $C_2$. The switch unit 160 disconnects the capacitor $C_2$ from the receiver 140 so that the capacitor $C_2$ may be connected to the power output unit 150 while energy stored in the capacitor $C_2$ is delivered to a load. The switch unit 160 also prevents the capacitor $C_2$ from being simultaneously connected to the receiver 140 and the power output unit 150.

A reception coil $L_2$ of the receiver 140 receives power through a mutual resonance with the transmission coil $L_1$ of the power transmission unit 120. Using the received power, the capacitor $C_2$ connected to the reception coil $L_2$ may be charged. The power output unit 150 delivers the power charged in the capacitor $C_2$ to a battery. The power output unit 150 delivers power to a load or a target device instead of the battery.

The receiver 140 includes basic circuit elements $R_2$, $L_2$, and $C_2$ by reflecting a physical property corresponding to the receiver 140. The power output unit 150 includes the capacitor $C_2$ and the battery. The switch unit 160 includes a plurality of switches. $V_{out}$ is a voltage across the capacitor $C_2$ corresponding to a portion of the energy received by the reception coil $L_2$.

As described above, a resonator isolation (RI) system is configured to transmit power by physically isolating the power input unit 110 and the power transmission unit 120. The structures of the receiver 140 and the power output unit 150 have several advantages when compared to a conventional scheme using an impedance matching. For example, a power amplifier is not needed because power may be supplied directly from a direct current (DC) source to a source resonator. Also, rectification through a rectifier may not be needed because energy is captured from power stored in a capacitor at a reception end. Further, transmission efficiency would not be responsive to a change in a distance between a transmission end and a reception end because impedance matching is not used. The RI system may be easily extended to a communication system that uses wireless power and includes a plurality of transmission ends and a plurality of reception ends.

Figure 2:
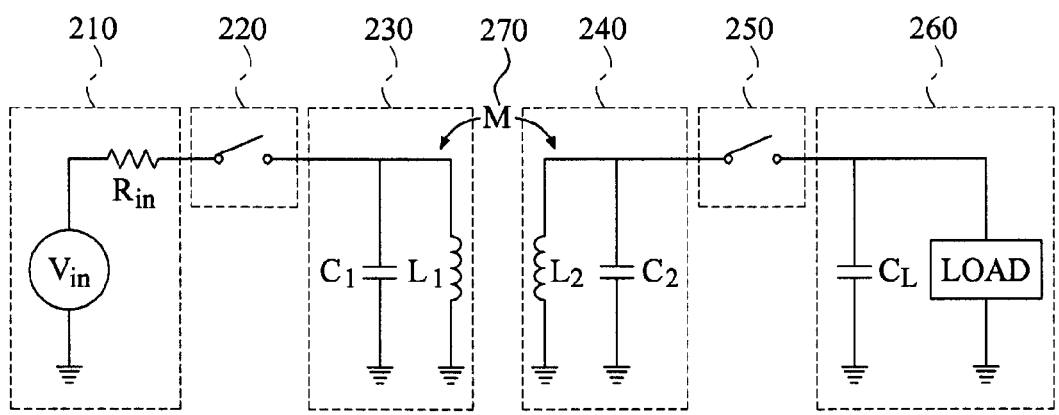
FIG. 2 is a diagram illustrating another example of a circuit of a communication system using wireless power.

FIG. 2 illustrates a circuit of a communication system using wireless power. A power charger 210 and a transmitter 230 are physically isolated by a switch, and a charger 240 and a power output unit 260 are physically isolated by another switch.

The communication system using wireless power corresponds to a source-target configuration having a source and a target. The communication system using wireless power includes a wireless power transmission device corresponding to a source and a wireless power reception device corresponding to a target.

The wireless power transmission device includes the power charger 210, a controller 220, and the transmitter 230. The power charger 210 includes a power supply device $V_{in}$ and a resistor $R_{in}$. A source resonator includes a capacitor $C_1$ and an inductor $L_1$. The transmitter 230 transmits energy stored in the source resonator through a mutual resonance between the source resonator and a target resonator. The controller 220 turns the switch on to provide power from the power charger 210 to the source resonator. The power supply device $V_{in}$ applies a voltage to the capacitor $C_1$, and may apply a current to the inductor $L_1$. In response to the wireless power transmission device reaching a steady state, a voltage applied to the capacitor $C_1$ becomes "0," and a current flowing through the inductor $L_1$ has a value of $V_{in}/R_{in}$. At the steady state, the inductor $L_1$ is charged through the applied current.

The controller 220 turns the switch OFF when power stored in the source resonator reaches a predetermined value at the steady state. A sample range of the predetermined value may correspond to the capacity of power to be stored in the source resonator. In one illustrative example, a sample value range of the predetermined value may be 90% of a capacity power to be stored in the source resonator. Information of the predetermined value may be set in the controller 220. In one example, the power charger 210 and the transmitter 230 are isolated from each other. In this instance, the source resonator initiates a self-resonance between the capacitor $C_1$ and the inductor $L_1$. For example, energy stored in the source resonator is delivered to the target resonator through a mutual resonance between the source resonator and the target resonator based on a mutual inductance M 270. In this example, a resonant frequency $f_1$ of the source resonator may be equal to a resonant frequency $f_2$ of the target resonator.

$$f_1 = \frac{1}{2\pi\sqrt{L_1 C_1}}, f_2 = \frac{1}{2\pi\sqrt{L_2 C_2}}$$

$$f_1 = f_2$$

The wireless power reception device includes the charger 240, a controller 250, and the power output unit 260. The target resonator includes a capacitor $C_2$ and an inductor $L_2$. When a mutual resonance occurs between the source resonator and the target resonator, the source resonator is isolated from the power supply device $V_{in}$, and the target resonator is isolated from a load and a capacitor $C_L$. The capacitor $C_2$ and the inductor $L_2$ of the target resonator are charged through a mutual resonance. The controller 250 turns a switch off to charge the target resonator. While the switch is in an OFF state, a resonant frequency of the source resonator is equal to a resonant frequency of the target resonator, and a mutual resonance occurs. In response to power charged in the target resonator reaching a predetermined value, the controller 250 turns the switch ON. Information of the predetermined value may be set in the controller 250. When the switch is turned ON, the capacitor $C_L$ is connected to the target resonator. Also, when the switch is turned ON, a resonant frequency of the target resonator changes to $f_2'$, as shown below.

$$f_2' = \frac{1}{2\pi\sqrt{L_2(C_2 + C_L)}}$$

Thus, the mutual resonance between the source resonator and the target resonator terminates. When $f_2'$ is sufficiently small compared to $f_2$, in consideration of Q(Quality) factor of the target resonator, a mutual resonant channel ceases to exist. The power output unit 260 delivers to the load power stored in the capacitor $C_2$ and the inductor $L_2$. The power output unit 260 delivers power in a scheme appropriate for the load.

The controller 250 turns the switch OFF when power charged in the target resonator has a value less than a predetermined value. The charger 240 would then charge the target resonator through a mutual resonance between the source resonator and the target resonator.

The controller 250 does not turn the switch ON when a mutual resonance occurs between the source resonator and the target resonator. Thus, a decrease in transmission efficiency due to a connection of a switch may be prevented.

The circuit of the communication system illustrated in FIG. 2 enables a good control of a point in time of capturing energy stored in the target resonator. While the configuration of FIG. 1 of delivering energy charged in a capacitor may capture energy stored in the capacitor, the configuration of FIG. 2 of capturing energy by changing a resonant frequency may capture energy stored in an inductor and a capacitor of the target resonator. As a result, in FIG. 2, a degree of freedom for the point in time of capturing energy may be enhanced.

A transmission end of an RI system may repeatedly charge or discharge energy to a source resonator through a switch connected between a power supply and the source resonator to transmit power or data. In accordance with an illustrative example, a single charging and discharging operation may be defined as a single symbol. A switch operates at a reception end with appropriate time synchronization according to operation intervals of a switch. This switch repeatedly charges and discharges at the transmission end so as to receive energy or data transmitted from the transmitted end. A time synchronization operation to maintain time synchronization to be constant according to an operation at the transmission end may be performed continuously at the reception end.

For example, the reception end may be informed of a point in time that the switch at the transmission end is turned OFF and turned ON. At this point in time, a mutual resonance starts, and energy stored in the target resonator has a peak value. A time synchronization operation is defined as an operation to search for information related to an ON and OFF timing of a switch at the transmission end, and operating the switch according to information related to an ON and OFF timing at a reception end. To search for the information related to an ON and OFF timing of a switch, data transmitted from the transmission end may be analyzed. In this example, an envelope detection operation is used to analyze data.

Figure 3:
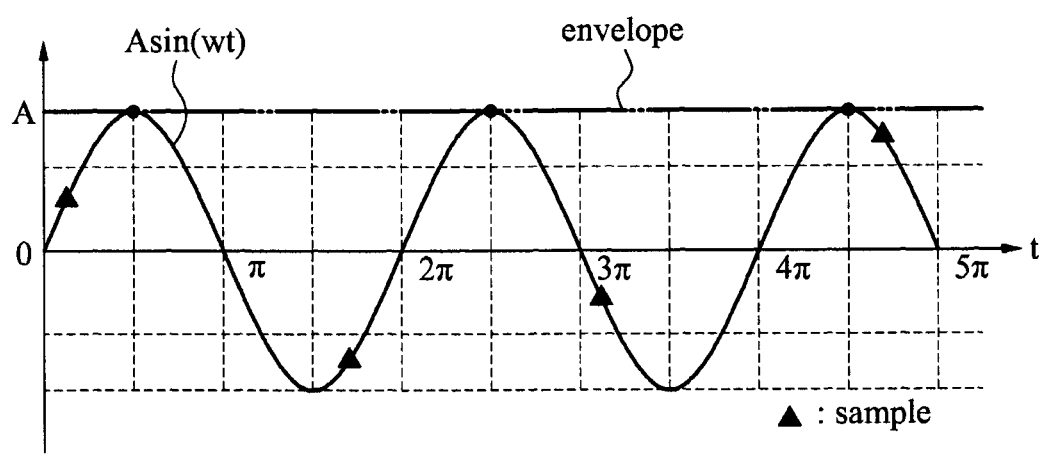
FIG. 3 is a graph illustrating an example of an envelope detected from a sine wave.

FIG. 3 illustrates an example of an envelope detected from a sine wave.

An envelope of a sine wave may be acquired by connecting peak values of the sine wave. A predetermined continuous sine wave x(t) is expressed by Equation 1.

$x(t) = A \sin(\omega t + \theta)$ [Equation 1]

In Equation 1, A denotes a predetermined constant value corresponding to an amplitude of x(t), and θ denotes a phase having a value in a range of 0 to 2π. [x(ωt$_1$), x(ωt$_2$), . . . , x(ωt$_m$)] corresponding to a signal sampled from x(t) is expressed by a sample sequence of [x(1), x(2), . . . , x(m)]. Here, an interval between two sampled signals is defined as Δt. The sample sequence of [x(1), x(2), . . . , x(m)] is expressed by Equation 2 using Δt, which corresponds to an interval between sample signals.

[A sin(ωt$_1$), A sin(ωt$_1$+ωΔt), A sin(ωt$_1$+2ωΔt), . . . , A sin(ωt$_1$+(m−1)ωΔt)] [Equation 2]

In one example, when Δt satisfies Δt=(½+n)*(π/ω), Equation 2 is expressed as shown below. In this example, n denotes a predetermined integer, and ω denotes an angular frequency.

[A sin(ωt$_1$), A cos(ωt$_1$), −A sin(ωt$_1$), −A cos(ωt$_1$), . . . ]
 if n=even

[A sin(ωt$_1$), −A cos(ωt$_1$), −A sin(ωt$_1$), A cos(ωt$_1$), . . . ]
 if n=odd When Δt=(½+n)*(π/ω) is satisfied, the sample sequence is expressed in a form in which ±A sin(ωt$_1$) and ±A cos(ωt$_1$) signals are repeated.

In this instance, when two adjacent sample signals are squared and the two squared adjacent sampled signals are summed, respectively, $A^2$ corresponding to square of an envelope component remains while a sine wave signal corresponding to a carrier component is eliminated, as expressed in Equation 3.

$$(\pm A \sin(\omega t_1))^2 + (\pm A \cos(\omega t_1))^2 = A^2 \qquad \text{[Equation 3]}$$

In Equation 3, when a square-root operation is performed on the squared envelope component, A corresponding to the envelope component is extracted.

Figure 4:
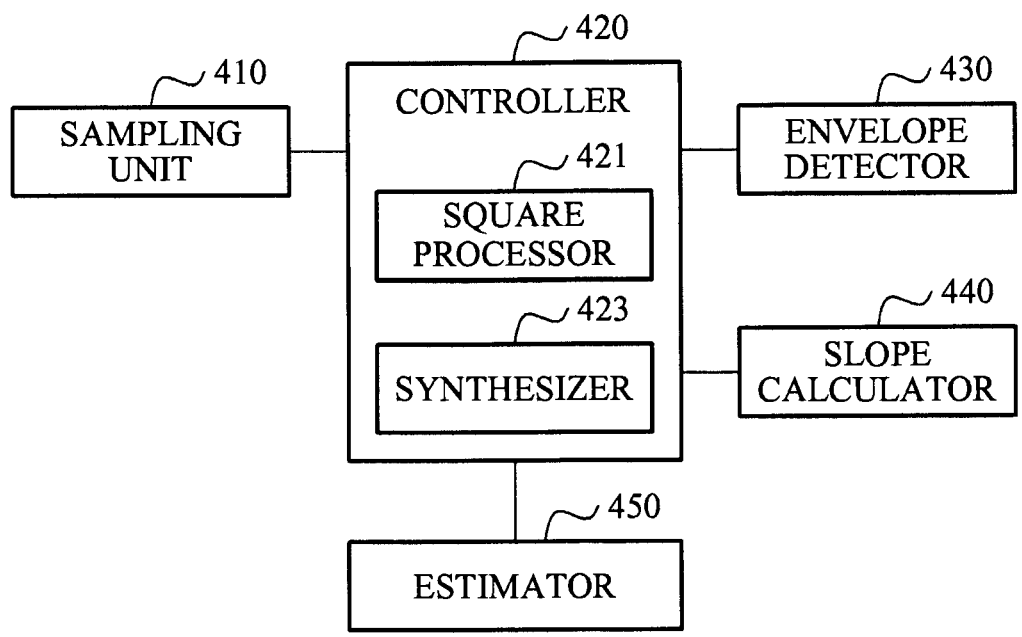
FIG. 4 is a block diagram illustrating an example of an apparatus for envelope detection.

FIG. 4 illustrates an example of an apparatus for envelope detection.

Referring to FIG. 4, an apparatus for envelope detection includes a sampling unit 410, a controller 420, and an envelope detector 430.

The sampling unit 410 samples a modulated signal. In this instance, the modulated signal includes an envelope component and a carrier component. The modulated signal corresponds to a waveform of energy stored in a target resonator through a mutual resonance with a source resonator. The modulated signal corresponds to a voice analog signal and may correspond to a video analog signal.

The sampling unit 410 samples the modulated signal at a predetermined time interval. In this instance, the predetermined time interval may correspond to $(\frac{1}{2}+n)*(\pi/\omega)$. In one example, n denotes an integer including 0, 1, 2, 3, ..., and $\omega$ denotes an angular frequency.

In response to the predetermined time interval satisfying $(\frac{1}{2}+n)*(\pi/\omega)$, sampling signals may be expressed by a cosine signal and a sine signal having the same carrier frequency component.

The sampling unit 410 determines a value of n in $(\frac{1}{2}+n)*(\pi/\omega)$ based on a bandwidth value of the modulated signal. As the value of n increases, a time interval between two adjacent sampling signals increases.

When a bandwidth of the modulated signal is sufficiently small compared to a carrier frequency of the modulated signal, the sampling unit 410 increases a sampling time interval by increasing the value of n. When the bandwidth of the modulated signal is sufficiently small when compared to the carrier frequency of the modulated signal, the sampling unit 410 samples the modulated signal at a relatively low sampling rate by increasing the value of n.

For example, when the bandwidth of the modulated signal is sufficiently small compared to the carrier frequency of the modulated signal, an envelope is detected through signals sampled at a relatively low sampling rate. In this example, it may be possible to determine whether the bandwidth of the modulated signal is sufficiently small compared to the carrier frequency of the modulated signal. Such determination is based on a predetermined value between the bandwidth of the modulated signal and the carrier frequency of the modulated signal.

The controller 420 performs a square-sum operation between two adjacent sampling signals among signals sampled from the modulated signal. In this instance, a time interval between the two adjacent sampling signals may satisfy the requirement of $(\frac{1}{2}+n)*(\pi/\omega)$. The square-sum operation refers to squaring each of two adjacent sampling signals, and summing values resulting from the squaring.

The controller 420 eliminates a carrier component from the modulated signal through the square-sum operation. In response to the time interval between the two adjacent sampling signals satisfying the requirement of $(\frac{1}{2}+n)*(\pi/\omega)$, the controller 420 eliminates a sine signal component and a cosine signal component by squaring and summing a sine signal and a cosine signal having the same carrier frequency component.

The controller 420 includes a square processor 421 and a synthesizer 423. The square processor 421 squares each of the two adjacent sampling signals. The square processor 421 performs a square operation in the square-sum operation. The synthesizer 423 synthesizes squared signals. The synthesizer 423 performs a sum operation in the square-sum operation.

The envelope detector 430 detects an envelope of the modulated signal from the modulated signal that the carrier component is eliminated. The envelope detector 430 detects the envelope of the modulated signal by performing a square-root operation on a value resulting from the square-sum operation. The square-sum operation is producing the value to be a square of an envelope component of the modulated signal. The envelope detector 430 detects the envelope component of the modulated signal through a square-root operation.

The controller 420 performs the SSR operation. The controller 420 eliminates a carrier component from the modulated signal, and detects the envelope component by performing a function of the envelope detector 430. The SSR operation refers to squaring each of the two adjacent sampling signals, summing values resulting from the squaring, and performing a square-root.

In one example, four signals correspond to the signals sampled in chronological order from the modulated signal. The four signals are referred to as a first sampling signal, a second sampling signal, a third sampling signal, and a fourth sampling signal. The controller 420 squares and synthesizes each of the first sampling signal and the second sampling signal, and squares and synthesizes each of the third sampling signal and the fourth sampling signal. In this example, carrier components included in the first sampling signal, the second sampling signal, the third sampling signal, and the fourth sampling signal are eliminated. In this instance, the controller 420 detects a square of a single envelope component using the first sampling signal and the second sampling signal that are adjacent to each other among the four signals, and detects a square of another envelope component using the third sampling signal and the fourth sampling signal that are adjacent to each other.

The controller 420 squares and synthesizes each of the first sampling signal and the second sampling signal, squares and synthesizes each of the second sampling signal and the third sampling signal, and squares and synthesizes each of the third sampling signal and the fourth sampling signal. In this example, carrier components included in the first sampling signal, the second sampling signal, the third sampling signal, and the fourth sampling signal are eliminated. The controller 420 detects a square of the envelope component at the same rate as a sampling rate by successively performing the square-sum operation between the two adjacent sampling signals.

Sampled signals correspond to signals from an analog-to-digital converter sampled from a waveform of energy stored in a target resonator through a mutual resonance with a source resonator. The modulated signal corresponds to a signal modulated according to a level of energy.

The apparatus for envelope detection may further include a slope calculator 440 and an estimator 450.

The slope calculator 440 calculates a slope of the detected envelope. The slope calculator 440 calculates a slope between two points having a predetermined interval on the detected envelope. The slope calculator 440 calculates a slope of a tangent at each point along the detected envelope.

The estimator 450 estimates a point in time at which the calculated slope reaches a maximum value, to be a starting point for a mutual resonance between the source resonator and the target resonator. The estimator 450 synchronizes a signal between a source and a target by estimating the starting point for a mutual resonance.

The slope of the envelope reaches a maximum at a point in time when a mutual resonance starts between a transmission end transmitting wireless power and a reception end receiving wireless power. The estimator 450 estimates the starting point for the mutual resonance using the following equation.

$$\text{signal\_start\_point} = \max_i \{\text{envelope}(i+\text{gap}) - \text{envelope}(i)\}$$

Here, a "signal_start_point" denotes the starting point of the mutual resonance, "i" denotes a point on the envelope, and a "gap" denotes a predetermined interval between two points on the envelope. That is, the "signal_start_point" is estimated to be "i" corresponding to a case in which a slope between two points having a predetermined interval on the envelope reaches a maximum.

As an example, the sampled signals correspond to signals from an analog-to-digital converter sampled from a voice analog signal. In an example, the modulated signal corresponds to a signal modulated from voice data.

As another example, the sampled signals may correspond to signals from an analog-to-digital converter sampled from a video analog signal. In this example, the modulated signal corresponds to a signal modulated from video data.

In an illustrative configuration, the controller 420 controls an overall operation of the apparatus for envelope detection, and performs functions of the sampling unit 410, the envelope detector 430, the slope calculator 440 and the estimator 450. Each component is separately illustrated in FIG. 4 so as to separately describe each function. Thus, in accordance with an alternative and illustrative configuration, the controller 420 processes all functions or a portion of all functions.

Figure 5:
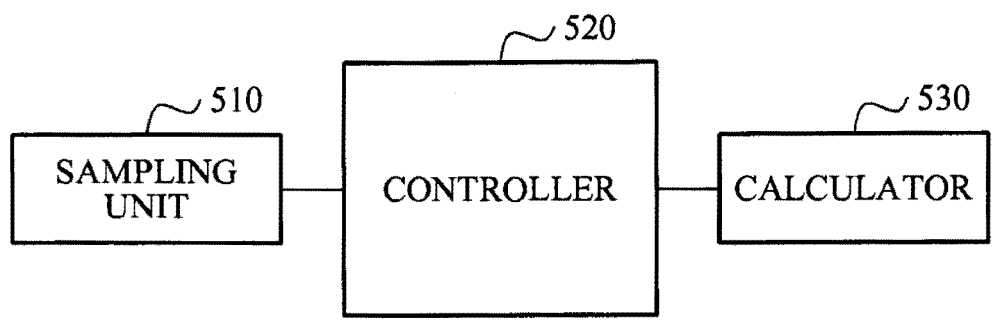
FIG. 5 is a block diagram illustrating another example of an apparatus for envelope detection.

FIG. 5 illustrates another example of an apparatus for envelope detection.

Referring to FIG. 5, an apparatus for envelope detection includes a sampling unit 510, a controller 520, and a calculator 530.

The sampling unit 510 performs a sampling in a modulated signal. In this example, the modulated signal includes an envelope component and a carrier component. The modulated signal corresponds to a waveform of energy stored in a target resonator through a mutual resonance with a source resonator. The modulated signal may further correspond to a voice analog signal. The modulated signal may also correspond to a video analog signal.

The sampling unit 510 samples the modulated signal at a predetermined time interval. In this instance, the predetermined time interval corresponds to $(\frac{1}{2}+n)*(\pi/\omega)$. Here, n denotes an integer, and $\omega$ denotes an angular frequency.

The sampling unit 510 determines a sampling time interval based on a bandwidth value of the modulated signal. In response to the bandwidth value of the modulated signal increasing, the sampling unit 510 decreases the sampling time interval. In response to the bandwidth value of the modulated signal decreasing, the sampling unit 510 increases the sampling time interval. In other words, the sampling unit 510 adjusts the sampling time interval in inverse proportion to a variation of the bandwidth value of the modulated signal.

The calculator 530 calculates a square of the envelope component of the modulated signal by performing a square-sum operation between two adjacent sampling signals among signals sampled from the modulated signal. The square-sum operation refers to squaring each of the two adjacent sampling signals, and summing values resulting from the squaring.

The calculator 530 calculates the envelope component of the modulated signal by performing an SSR operation between the two adjacent sampling signals among signals sampled from the modulated signal. In one example, the SSR operation refers to squaring each of the two adjacent sampling signals, summing values resulting from the squaring, and performing a square-root.

The calculator 530 calculates a square of the envelope component at the same rate as a sampling rate to sample the modulated signal. The modulated signal is sampled by successively performing a square-sum operation between the two adjacent sampling signals.

The controller 520 may control an overall operation of the apparatus for envelope detection, and may perform functions of the sampling unit 510 and the calculator 530. Each component is separately illustrated in FIG. 5 to separately describe each function. Thus, when an actual product is implemented, the controller 520 may process all functions or a portion of all functions.

Each of the sampling unit 410, the controller 420, the square processor 421, the synthesizer 423, the envelope detector 430, the slope calculator 440, the estimator 450, the sampling unit 510, the controller 520, and the calculator 530 of FIGS. 4 and 5 may include, but are not limited to, (1) one or more microprocessors, (2) one or more processor(s) with accompanying digital signal processor(s), (3) one or more processor(s) without accompanying digital signal processor(s), (3) one or more special-purpose computer chips, (4) one or more field-programmable gate arrays (FPGAS), (5) one or more controllers, (6) one or more application-specific integrated circuits (ASICS), (7) one or more computer(s), or (8) or any other device capable of responding to and executing instructions in a defined manner. The sampling unit 410, the controller 420, the square processor 421, the synthesizer 423, the envelope detector 430, the slope calculator 440, the estimator 450, the sampling unit 510, the controller 520, and the calculator 530 may include one or more memories (e.g., ROM, RAM, etc.) and that the relevant structure/hardware has been programmed in such a way to carry out the inventive function.

Figure 6:
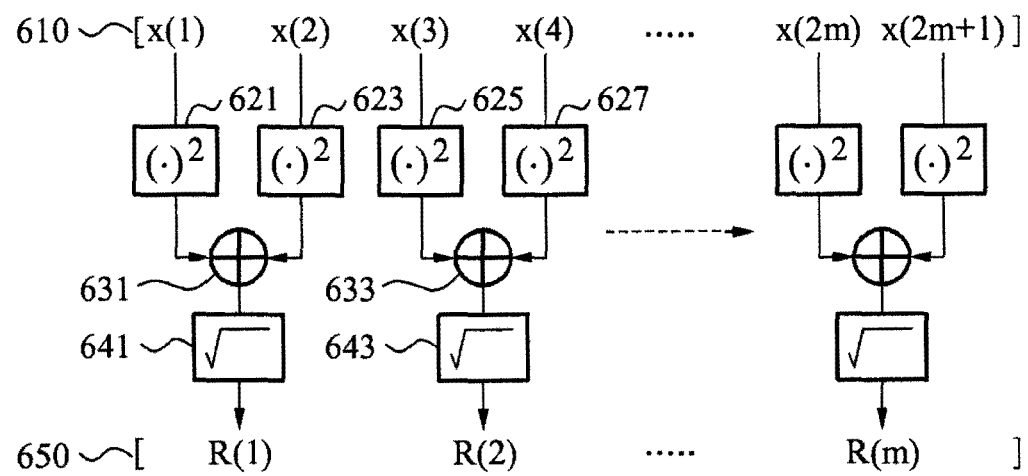
FIG. 6 is a diagram illustrating an example of detecting an envelope of a modulated signal at a half rate of sampling signals.

FIG. 6 illustrates an example of detecting an envelope of a modulated signal at a half rate of sampling signals using, for example, the apparatus for envelope detection of FIG. 4 or FIG. 5.

A modulated signal x(t) from which an envelope is desired to be detected may be expressed by an envelope component R(t) and a carrier component $\cos(\omega t+\theta)$.

$$x(t) = R(t)\cos(\omega t+\theta)$$

Here, $\theta$ denotes a phase having a value in a range of 0 to $2\pi$. $[x(\omega t_1), x(\omega t_2), \ldots, x(\omega t_m)]$ correspond to a signal sampled from x(t), which may be expressed by a sample sequence of $[x(1), x(2), \ldots, x(m)]$. In this instance, an interval between two sample signals may be defined as $\Delta t$.

Referring to FIG. 6, a sample sequence 610 is expressed by $[x(1), x(2), x(3), x(4), \ldots, x(2m), x(2m+1)]$. The apparatus for envelope detection of FIG. 4 or FIG. 5 may sample 2m+1 sampling signals from a modulated signal. In this instance, $\Delta t$ corresponds to a sampling time interval between sampling signals that is set to satisfy $\Delta t = (\frac{1}{2}+n)*(\pi/\omega)$. In one example, n denotes a predetermined integer, and $\omega$ denotes an angular frequency. The apparatus for envelope detection may perform an SSR operation on two adjacent sampling signals, thereby detecting an envelope of the modulated signal.

The apparatus for envelope detection of FIG. 4 or FIG. 5 may square each sampling signal. For example, the apparatus for envelope detection obtains a square 621 of a sampling signal x(1), a square 623 of a sampling signal x(2), a square 625 of a sampling signal x(3), a square 627 of a sampling signal x(4), . . . , a square of a sampling signal x(2m), and a square of a sampling signal x(2m+1).

In response to the sampling time interval $\Delta t$ satisfying $\Delta t=(\frac{1}{2}+n)*(\pi/\omega)$, the apparatus for envelope detection sums squares of two adjacent sampling signals, thereby eliminating a carrier component. For example, the apparatus for envelope detection obtains a sum 631 of a square of the sampling signal x(1) and a square of the sampling signal x(2). The apparatus for envelope detection obtains a sum 633 of a square of the sampling signal x(3) and a square of the sampling signal x(4). Further, the apparatus for envelope detection obtains a sum of a square of the sampling signal x(2m) and a square of the sampling signal x(2m+1).

The apparatus for envelope detection detects an envelope component by performing a square-root operation on a result obtained by summing squares of two sampling signals. For example, the apparatus for envelope detection detects an envelope component R(1) by performing a square-root operation 641 on a result obtained by summing the squared value of the sampling signal x(1) and the squared value of the sampling signal x(2). The apparatus for envelope detection detects an envelope component R(2) by performing a square-root operation 643 on a result obtained by summing the squared value of the sampling signal x(3) and the squared value of the sampling signal x(4). Further, the apparatus for envelope detection detects an envelope component R(m) by performing a square-root operation on a result obtained by summing the squared value of the sampling signal x(2m) with the squared value of the sampling signal x(2m+1).

As a result, the apparatus for envelope detection detects an envelope including a sequence 650 of envelope components. In this instance, the apparatus for envelope detection detects m envelope components from 2m+1 sampling signals, thereby estimating an envelope of a modulated signal. That is, the apparatus for envelope detection estimates an envelope by detecting envelope components at a half rate of a sampling rate of a modulated signal.

Figure 7:
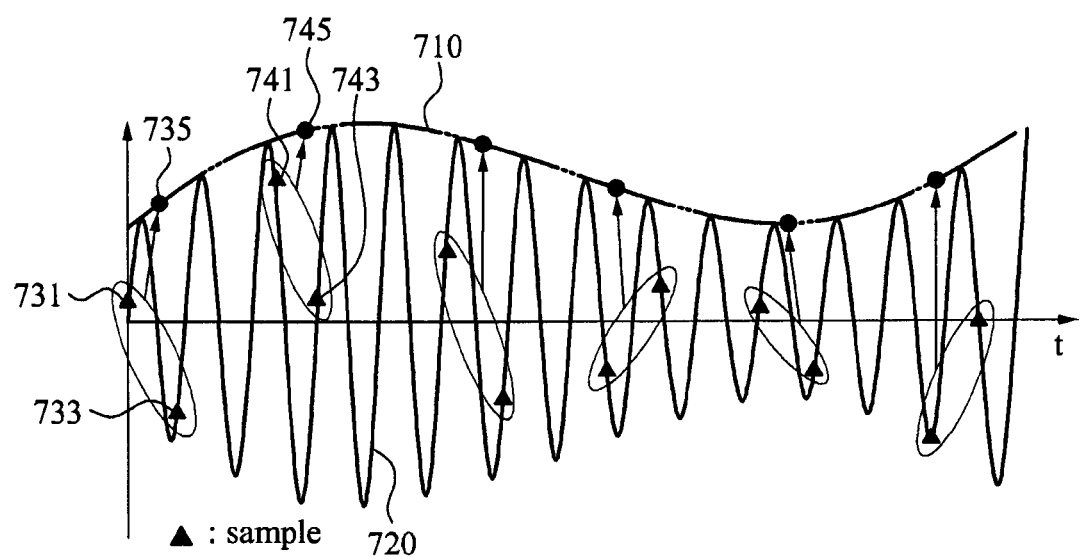
FIG. 7 is a graph illustrating an example of an envelope detected at a half rate of sampling signals.

FIG. 7 illustrates an example of an envelope detected at a half rate of sampling signals using, for example, the apparatus for envelope detection of FIG. 4 or FIG. 5.

Referring to FIG. 6, an SSR operation is performed between x(1) and x(2), between x(3) and x(4), . . . , between x(2m) and x(2m+1). Thus, m envelope components may be detected. FIG. 7 illustrates envelope components and sampling signals of a modulated signal calculated in a scheme described with reference to FIG. 6.

Referring to FIG. 7, a modulated signal may be expressed by an envelope 710 and a carrier component 720. In this instance, in response to the SSR operation performed between two adjacent sampling signals 731 and 733, an envelope component 735 may be detected. In response to the SSR operation performed between two adjacent sampling signals 741 and 743, an envelope component 745 may be detected. Further, the apparatus for envelope detection detects envelope components by performing the SSR operation on two adjacent sampling signals that are sampled from the modulated signal. The apparatus for envelope detection estimates the envelope 710 of the modulated signal by connecting envelope components.

Figure 8:
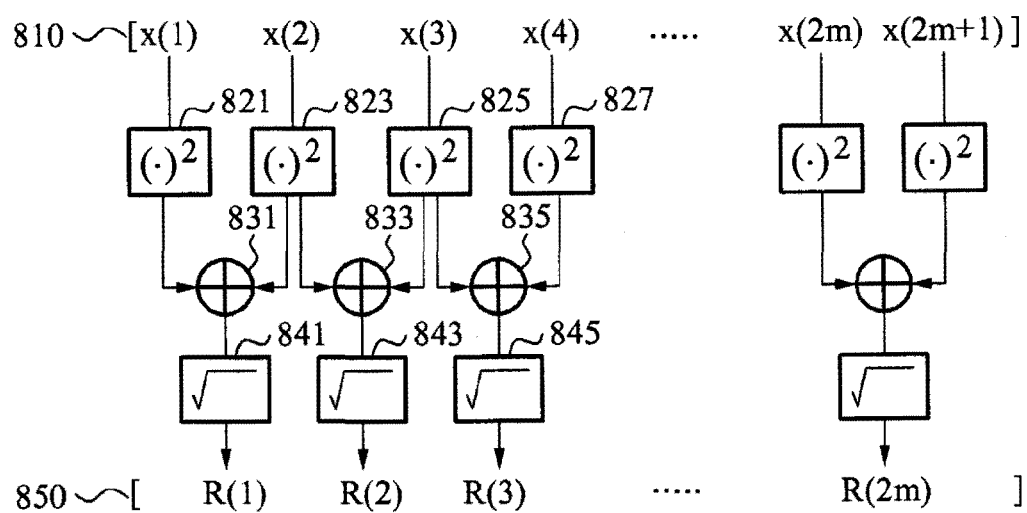
FIG. 8 is a diagram illustrating an example of detecting an envelope of a modulated signal at a uniform rate as sampling signals.

FIG. 8 illustrates an example of detecting an envelope of a modulated signal at a uniform rate as sampling signals using, for example, the apparatus for envelope detection of FIG. 4 or FIG. 5.

Referring to FIG. 8, a sample sequence 810 is expressed by [x(1), x(2), x(3), x(4), . . . , x(2m), x(2m+1)]. An apparatus for envelope detection may sample 2m+1 sampling signals from a modulated signal. In this instance, $\Delta t$ corresponding to a sampling time interval between sampling signals may be set to satisfy $\Delta t=(\frac{1}{2}+n)*(\pi/\omega)$. In one example, n denotes a predetermined integer, and $\omega$ denotes an angular frequency.

The apparatus for envelope detection performs the SSR operation on two adjacent sampling signals to detect an envelope of the modulated signal.

The apparatus for envelope detection squares each sampling signal. For example, the apparatus for envelope detection obtains a square 821 of a sampling signal x(1), a square 823 of a sampling signal x(2), a square 825 of a sampling signal x(3), a square 827 of a sampling signal x(4), . . . , a square of a sampling signal x(2m), and a square of a sampling signal x(2m+1).

In response to the sampling time interval $\Delta t$ satisfying $\Delta t=(\frac{1}{2}+n)*(\pi/\omega)$, the apparatus for envelope detection sums squares of two adjacent sampling signals, thereby eliminating a carrier component.

Unlike FIG. 6, the apparatus for envelope detection of FIG. 8 obtains a sum 831 of the square 821 of the sampling signal x(1) and the square 823 of the sampling signal x(2). Further, the apparatus for envelope detection obtains a sum 833 of the square 823 of the sampling signal x(2) and the square 825 of the sampling signal x(3). That is, the sampling signal x(2) is used to obtain both of the sum 831 and the sum 833. The apparatus for envelope detection obtains a sum 835 of the square 825 of the sampling signal x(3) and the square 827 of the sampling signal x(4). Further, the apparatus for envelope detection obtains a sum of the square of the sampling signal x(2m) and the square of the sampling signal x(2m+1).

The apparatus for envelope detection detects an envelope component by performing a square-root operation on a result obtained by summing squares of two sampling signals. For example, the apparatus for envelope detection detects an envelope component R(1) by performing a square-root operation 841 on the sum 831 of the square 821 of the sampling signal x(1) and the square 823 of the sampling signal x(2). The apparatus for envelope detection detects an envelope component R(2) by performing a square-root operation 843 on the sum 833 of the square 823 of the sampling signal x(2) and the square 825 of the sampling signal x(3).

The apparatus for envelope detection detects an envelope component R(3) by performing a square-root operation 845 on the sum 835 of the square 825 of the sampling signal x(3) and the square 827 of the sampling signal x(4). Further, the apparatus for envelope detection detects an envelope component R(2m) by performing a square-root operation on a result obtained by summing the squared value of the sampling signal x(2m) and the squared value of the sampling signal x(2m+1). The apparatus for envelope detection detects a relatively great number of envelope components by performing the SSR operation on sampling signals so that a square of each sampling signal positioned in a middle of three adjacent sampling signals may be summed with each of squares of the other sampling signals.

As a result, the apparatus for envelope detection detects an envelope including a sequence 850 of envelope components. In this instance, the apparatus for envelope detection detects 2m envelope components from 2m+1 sampling signals, thereby estimating an envelope of a modulated signal. That is, the apparatus for envelope detection estimates an envelope by detecting envelope components close to the same rate as a sampling rate of a modulated signal.

Accordingly, a relatively great number of envelope components may be detected, and an envelope may be more precisely estimated.

Figure 9:
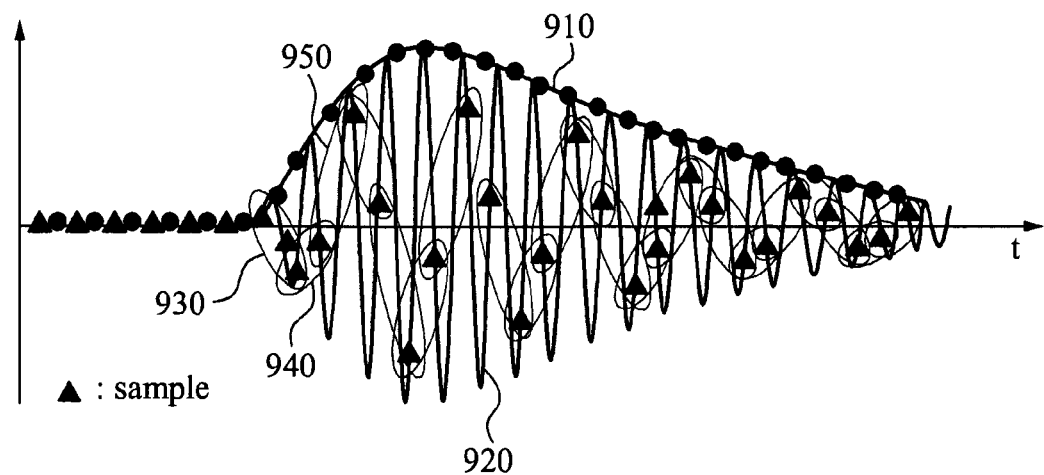
FIG. 9 is a graph illustrating an example of an envelope detected at the same rate as sampling signals.

FIG. 9 illustrates an example of an envelope detected at the same rate as sampling signals.

Referring to FIG. 8, the SSR operation is performed between x(1) and x(2), between x(2) and x(3), between x(3) and x(4), . . . , between x(2m) and x(2m+1). Thus, 2m envelope components may be detected. FIG. 9 illustrates envelope components and sampling signals of a modulated signal calculated in a scheme described with reference to FIG. 8.

Referring to FIG. 9, a modulated signal is expressed by an envelope 910 and a carrier component 920. In this instance, in response to the SSR operation performed between two adjacent sampling signals 930, an envelope component is detected. In response to the SSR operation performed between two adjacent sampling signals 940, an envelope component is detected. Further, an apparatus for envelope detection detects envelope components by performing the SSR operation on two adjacent sampling signals 950 that are sampled from the modulated signal. The apparatus for envelope detection estimate the envelope 910 of the modulated signal by connecting envelope components.

Figure 10:
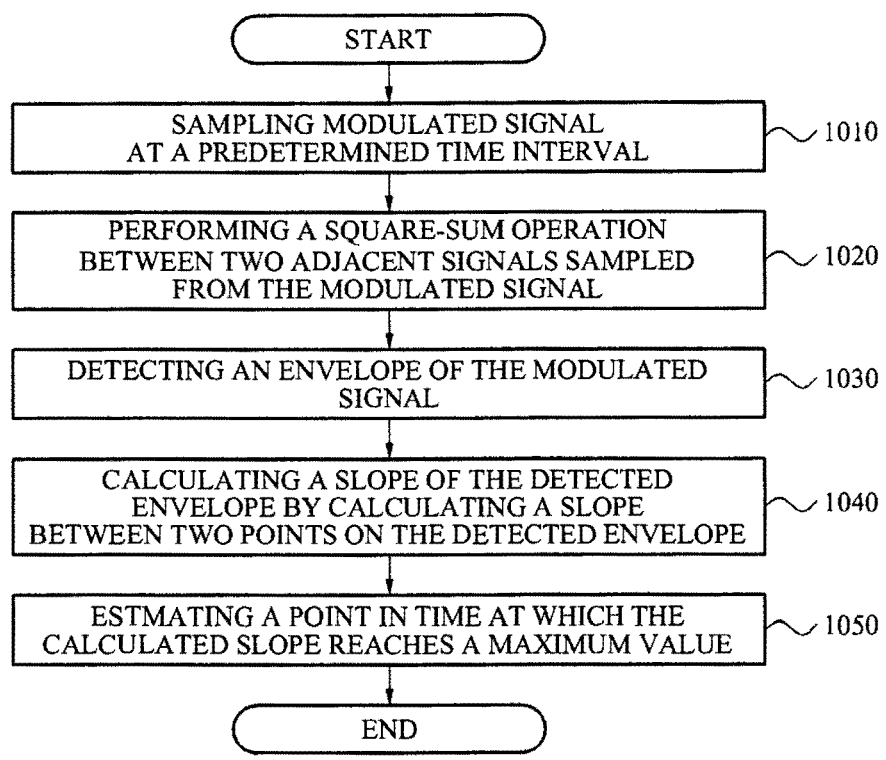
FIG. 10 is a diagram illustrating an example of a method for envelope detection.

In accordance with an illustrative example, FIG. 10 a method is described for envelope detection. At 1010, the method samples the modulated signal at a predetermined time interval. In this instance, the predetermined time interval may correspond to $(\frac{1}{2}+n)*(\pi/\omega)$. In one example, n denotes an integer, and $\omega$ denotes an angular frequency. The method determines a value of n in $(\frac{1}{2}+n)*(\pi/\omega)$ based on a bandwidth value of the modulated signal. As the value of n increases, a time interval between two adjacent sampling signals increases.

When a bandwidth of the modulated signal is sufficiently small compared to a carrier frequency of the modulated signal, at 1010, the method increases a sampling time interval by increasing the value of n. When the bandwidth of the modulated signal is sufficiently small when compared to the carrier frequency of the modulated signal, at 1010, the method samples the modulated signal at a relatively low sampling rate by increasing the value of n.

At 1020, the method is configured to perform a square-sum operation between two adjacent signals sampled from the modulated signal. In this instance, a time interval between the two adjacent sampling signals may satisfy the requirement of $(\frac{1}{2}+n)*(\pi/\omega)$. The method eliminates a carrier component from the modulated signal through the square-sum operation. In response to the time interval between the two adjacent sampling signals satisfying the requirement of $(\frac{1}{2}+n)*(\pi/\omega)$, the method eliminates a sine signal component and a cosine signal component by squaring and summing a sine signal and a cosine signal having the same carrier frequency component.

The method squares each of the two adjacent sampling signals. For example, the method performs a square operation in the square-sum operation. The method synthesizes squared signals by performing a sum operation in the square-sum operation.

At 1030, the method detects an envelope of the modulated signal from the modulated signal that the carrier component is eliminated. The method detects the envelope of the modulated signal by performing a square-root operation on a value resulting from the square-sum operation. The value resulting from the square-sum operation refers to a square of an envelope component of the modulated signal. The square-sum operation is producing the value to be a square of an envelope component of the modulated signal.

In one example, four signals correspond to the signals sampled in chronological order from the modulated signal. The four signals are referred to as a first sampling signal, a second sampling signal, a third sampling signal, and a fourth sampling signal. In this example, the method squares and synthesizes each of the first sampling signal and the second sampling signal, and squares and synthesizes each of the third sampling signal and the fourth sampling signal. Carrier components included in the first sampling signal, the second sampling signal, the third sampling signal, and the fourth sampling signal are eliminated. In this instance, the method detects a square of a single envelope component using the first sampling signal and the second sampling signal that are adjacent to each other among the four signals, and detects a square of another envelope component using the third sampling signal and the fourth sampling signal that are adjacent to each other.

The method squares and synthesizes each of the first sampling signal and the second sampling signal, squares and synthesizes each of the second sampling signal and the third sampling signal, and squares and synthesizes each of the third sampling signal and the fourth sampling signal. In this example, carrier components included in the first sampling signal, the second sampling signal, the third sampling signal, and the fourth sampling signal are eliminated. The method detects a square of the envelope component at the same rate as a sampling rate by successively performing the square-sum operation between the two adjacent sampling signals.

At 1040, the method calculates a slope of the detected envelope by calculating a slope between two points having a predetermined interval on the detected envelope. The method at 1040 calculates a slope of a tangent at each point along the detected envelope.

At 1050, the method estimates a point in time at which the calculated slope reaches a maximum value to be a starting point for a mutual resonance between the source resonator and the target resonator. The method synchronizes a signal between a source and a target by estimating the starting point for a mutual resonance.

The slope of the envelope reaches a maximum at a point in time when a mutual resonance starts between a transmission end transmitting wireless power and a reception end receiving wireless power.

Figure 11:
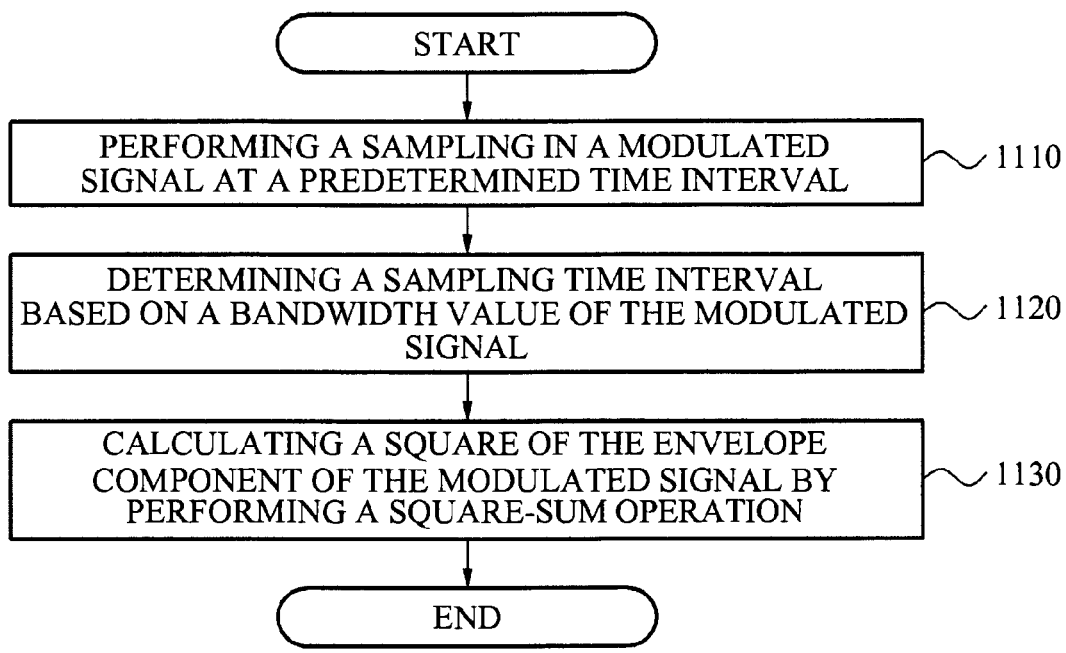
FIG. 11 is a diagram illustrating another example of a method for envelope detection.

FIG. 11 illustrates another example of a method for envelope detection. At 1110, the method performs a sampling in a modulated signal at a predetermined time interval. In this instance, the predetermined time interval corresponds to $(\frac{1}{2}+n)*(\pi/\omega)$. Here, n denotes an integer, and $\omega$ denotes an angular frequency. At 1120, the method determines a sampling time interval based on a bandwidth value of the modulated signal. In response to the bandwidth value of the modulated signal increasing, the method decreases the sampling time interval. In response to the bandwidth value of the modulated signal decreasing, the method increases the sampling time interval. In other words, the method adjusts the sampling time interval in inverse proportion to a variation of the bandwidth value of the modulated signal. At 1130, the method calculates a square of the envelope component of the modulated signal by performing a square-sum operation between two adjacent sampling signals among signals sampled from the modulated signal.

Program instructions to perform a method for envelope detection described herein, or one or more operations thereof, may be recorded, stored, or fixed in one or more non-transitory computer-readable storage media. The program instructions may be implemented by a computer. For example, the computer may cause a processor to execute the program instructions. The media may include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable recording mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for envelope detection, the apparatus comprising:
    a controller configured to perform a square-sum operation between two adjacent signals sampled from a modulated signal to eliminate a carrier component from the modulated signal, the two adjacent signals being sampled at a sampling time interval dependent on a bandwidth value of the modulated signal; and
    an envelope detector configured to detect an envelope of the modulated signal in which the carrier component is eliminated.

2. The apparatus of claim 1, further comprising:
    a sampler configured to sample the modulated signal at the sampling time interval between the two adjacent signals sampled that satisfies $(\frac{1}{2}+n)*(\pi/\omega)$, wherein n corresponds to an integer and $\omega$ corresponds to an angular frequency.

3. The apparatus of claim 2, wherein the sampler is configured to determine a value of n based on a bandwidth value of the modulated signal.

4. The apparatus of claim 1, wherein the controller comprises:
    a square processor configured to square each of the two adjacent signals sampled; and
    a synthesizer configured to synthesize the two squared adjacent signals sampled.

5. The apparatus of claim 1, wherein the envelope detector is configured to perform a square-root operation on a value resulting from the square-sum operation to detect the envelope of the modulated signal.

6. The apparatus of claim 5, wherein the value resulting from the square-sum operation refers to a square of an envelope component of the modulated signal.

7. The apparatus of claim 1, wherein:
    a first sampling signal, a second sampling signal, a third sampling signal, and a fourth sampling signal are sampled from the modulated signal in a chronological order; and
    the controller squares and synthesizes each of the first sampling signal and the second sampling signal, and squares and synthesizes each of the third sampling signal and the fourth sampling signal.

8. The apparatus of claim 1, wherein:
    a first sampling signal, a second sampling signal, a third sampling signal, and a fourth sampling signal are sampled from the modulated signal in a chronological order, and
    the controller squares and synthesizes each of the first sampling signal and the second sampling signal, squares and synthesizes each of the second sampling signal and the third sampling signal, and squares and synthesizes each of the third sampling signal and the fourth sampling signal.

9. The apparatus of claim 1, wherein the sampled signals correspond to signals from an analog-to-digital converter sampled from a waveform of energy stored in a target resonator through a mutual resonance with a source resonator.

10. The apparatus of claim 9, further comprising:
    a slope calculator configured to calculate a slope of the detected envelope; and
    an estimator configured to estimate a point in time at which the calculated slope reaches a maximum value, to be a starting point for a mutual resonance between the source resonator and the target resonator.

11. The apparatus of claim 1, wherein the sampled signals correspond to signals from an analog-to-digital converter sampled from a voice analog signal.

12. The apparatus of claim 1, wherein the sampled signals correspond to signals from an analog-to-digital converter sampled from a video analog signal.

13. The apparatus of claim 1, wherein the sampling time interval increases in response to the bandwidth value of a carrier frequency of the modulated signal being less than a predetermined value.

14. An apparatus for envelope detection, comprising:
    a sampler configured to sample a modulated signal; and
    a calculator configured to perform a square-sum operation between two adjacent signals sampled from the modulated signal to calculate a square of an envelope component of the modulated signal, the two adjacent signals being sampled at a sampling time interval dependent on a bandwidth value of the modulated signal.

15. The apparatus of claim 14, wherein the sampler is configured to sample the modulated signal at the sampling time interval between the two adjacent signals sampled that satisfies $(\frac{1}{2}+n)*(\pi/\omega)$, wherein n corresponds to an integer and $\omega$ corresponds to an angular frequency.

16. The apparatus of claim 15, wherein the sampler is configured to determine the sampling time interval based on a bandwidth value of the modulated signal.

17. The apparatus of claim 14, wherein the calculator calculates a square of the envelope component at a same rate as a sampling rate to sample the modulated signal by successively performing a square-sum operation between the two adjacent sampling signals.

18. A method for envelope detection, comprising:
performing a square-sum operation between two adjacent signals sampled from a modulated signal to eliminate a carrier component from the modulated signal, the two adjacent signals being sampled at a sampling time interval dependent on a bandwidth value of the modulated signal; and
detecting an envelope of the modulated signal in which the carrier component is eliminated.

19. The method of claim 18, further comprising:
sampling the modulated signal at the sampling time interval between the two adjacent signals sampled that satisfies $(½+n)*(\pi/\omega)$, wherein n corresponds to an integer and $\omega$ corresponds to an angular frequency.

20. The method of claim 19, wherein the performing comprises determining a value of n based on a bandwidth value of the modulated signal.

21. The method of claim 18, wherein the detecting comprises performing a square-root operation on a value resulting from the square-sum operation to detect the envelope of the modulated signal.

22. The method of claim 21, wherein the square-sum operation comprises outputting the value as a square of an envelope component of the modulated signal.

23. The method of claim 18, wherein the detecting of the envelope of the modulated signal comprises performing a square-root operation on a value resulting from the square-sum operation, wherein the value resulting from the square-sum operation refers to a square of an envelope component of the modulated signal.

24. The method of claim 23, further comprising:
calculating a slope of the detected envelope; and
estimating a point in time at which the calculated slope reaches a maximum value, to be a starting point for a mutual resonance between the source resonator and the target resonator.

25. The method of claim 18, further comprising:
sampling a first sampling signal, a second sampling signal, a third sampling signal, and a fourth sampling signal from the modulated signal in a chronological order;
squaring and synthesizing each of the first sampling signal and the second sampling signal; and
squaring and synthesizing each of the third sampling signal and the fourth sampling signal.

26. The method of claim 18, further comprising:
sampling a first sampling signal, a second sampling signal, a third sampling signal, and a fourth sampling signal from the modulated signal in a chronological order;
squaring and synthesizing each of the first sampling signal and the second sampling signal;
squaring and synthesizing each of the second sampling signal and the third sampling signal; and
squaring and synthesizing each of the third sampling signal and the fourth sampling signal.

27. A computer program embodied on a non-transitory computer readable medium, the computer program being configured to control a processor to perform the method of claim 18.

* * * * *